United States Patent [19]
Okabe et al.

[11] Patent Number: 5,169,793
[45] Date of Patent: Dec. 8, 1992

[54] METHOD OF MAKING AN INSULATED GATE BIPOLAR TRANSISTOR HAVING GATE SHIELD REGION

[75] Inventors: Naoto Okabe, Chita; Tsuyoshi Yamamoto, Kariya; Naohito Kato, Kariya, all of Japan

[73] Assignee: Nippondenso Co., Ltd., Kariya, Japan

[21] Appl. No.: 710,721

[22] Filed: Jun. 7, 1991

[30] Foreign Application Priority Data

Jun. 8, 1990 [JP] Japan .................................. 2-151353
May 31, 1991 [JP] Japan .................................. 3-129382

[51] Int. Cl.$^5$ ...................... H01L 2/265; H01L 49/00
[52] U.S. Cl. ......................................... 437/31; 437/6; 257/328
[58] Field of Search ..................... 437/31, 6; 357/23.4, 357/23.14

[56] References Cited

U.S. PATENT DOCUMENTS

| | | | |
|---|---|---|---|
| 4,631,564 | 12/1986 | Neilson et al. | 357/23.4 |
| 4,682,195 | 7/1987 | Yilmaz | 357/23.4 |
| 4,990,975 | 2/1991 | Hagino | 357/23.4 |
| 5,084,401 | 1/1992 | Hagino | 437/41 |
| 5,095,343 | 3/1992 | Klodzinski et al. | 357/23.4 |

FOREIGN PATENT DOCUMENTS 62-76671 4/1987 Japan .
63-104480 5/1988 Japan .
63-104481 5/1988 Japan .

*Primary Examiner*—Olik Chaudhuri
*Assistant Examiner*—Long Pham
*Attorney, Agent, or Firm*—Cushman, Darby & Cushman

[57] ABSTRACT

A p type pad well layer is formed at the surface of an n$^-$ type drain layer under a gate bonding pad and the surface thereof is provided with a p$^{++}$ type pad layer to be provided with lower resistivity. The p$^{++}$ type pad layer is connected with a source electrode through a contact hole. Since the gate electrode supplying each cell with gate potential is of a pattern having extensions in a comb-teeth form arranged along the boundary between the pad region and the cell region, there is present substantially no gate electrode under the pad. Hence, the introduction of impurities into the entire surface of the well layer under the pad region can be performed simultaneously with formation of p$^{++}$ type contact layers after the formation of the gate electrode, and accordingly, the low resistance p$^{++}$ type pad layer can be easily formed. The p$^{++}$ type pad layer serves as a low resistance path for allowing the holes flowing into the region under the pad region of the insulated gate bipolar transistor to escape to the source electrode, whereby occurrence of the latch up and increase in the turn-off time due to the minority carriers concentrating into the border portion cell located adjacent to the pad region can be prevented.

2 Claims, 16 Drawing Sheets

METHOD OF MAKING AN INSULATED GATE BIPOLAR TRANSISTOR HAVING GATE SHIELD REGION

BACKGROUND OF THE INVENTION

1. Field of the Invention

The present invention relates to an insulated gate bipolar transistor which can be used as an element of an electric switch for electric power.

2. Description of the Related Arts

There have been many reports recently related to an insulated gate bipolar transistor used as a switching element for electric power. This element, while having a configuration similar to a power MOSFET, achieves coexistence of a high withstand voltage and a low ON resistance, which the power MOSFET has been unable to achieve, by providing a semiconductor layer having an opposite conductivity type to that of a source layer in a drain region, thereby producing conductivity modulation in the highly resistive drain layer to lower its ON resistance.

FIG. 25 is a longitudinal sectional view schematically showing the main portion of an n-channel type insulated gate bipolar transistor. The main portion is structured of a $p^+$ type drain layer 1, n-type drain layer 2, gate oxide film 3, gate electrode 4, p type base layer 5, $n^+$ type source layer 6, channel 7, interlayer insulating film 10, source electrode 14, and drain electrode 16.

When a voltage over a fixed threshold voltage with respect to the source electrode 14 is applied to the gate electrode 4, the surface of the p type base layer 5 under the gate electrode 4 is inverted to form the channel 7, through which electrons from the $n^+$ type source layer 6 are allowed to flow into the $n^-$ type drain layer 2. The electrons flowing therein lower the potential of the $n^-$ type drain layer 2 and provides a forward bias to the $p^+n^-$ junction on the side toward the drain. As a result, holes as minority carriers flow from the $p^+$ type drain layer 1 into the $n^-$ type drain layer 2. By the inflow of the holes, the $n^-$ type drain layer 2 is given conductivity modulation to greatly reduce its resistance value and becomes able to conduct a great amount of electric current.

However, as the current density increases within the element with the insulated gate bipolar transistor, a voltage drop due to the transverse resistance within the p type base layer 5 under the $n^+$ type source layer 6 increases, whereby the junction between the $n^+$ type source layer 6 and the p type base layer 5 is forward biased. Hence, electrons flow from the $n^+$ type source layer 6 into the p type base layer 5, and as a result, a thyristor operation is casted due to a parasitic thyristor composed of the $p^+$ type drain layer 1, $n^-$ type drain layer 2, p type base layer 5, and the $n^+$ type source layer 6, that is, the so-called latch-up phenomenon occurs in which the current flowing through the semiconductor element becomes unable to turn OFF even if the gate-to-source bias is reduced to zero. Thus, the current amount controllable by the gate comes to be limited by the latch-up phenomenon (lowering of the latch-up current). The latch-up phenomenon occurs more easily when the element is turned OFF.

Further, the holes as the minority carriers injected into the $n^-$ type drain layer 2 in the insulated gate bipolar transistor remain accumulated in the $n^-$ type drain layer 2 even after the voltage applied to the gate electrode 4 has been reduced to zero and the flow of electrons in the channel 7 has been stopped, and the current continues to flow until the holes are flowed out through the source electrode 14 or the holes recombine with electrons to disappear. Thus, the turn-off time is prolonged. Accordingly, when the insulated gate bipolar transistor is used as a power switching element for motor control by a PWM (Pulse Width Modulation) system, for example, it becomes unable to increase the current switching frequency and the range of power control is thereby limited.

The latch-up phenomenon and increase in the turn-off time due to accumulated holes are more frequently occur at specific positions such as the border portion of the repeatedly disposed cells in the insulated gate bipolar transistor.

The reason for the above will be described below with reference to FIG. 26. FIG. 26 shows a sectional view of the structure in the vicinity of a gate bonding pad 15a as an example of the border portion of the cells.

As shown in FIG. 26, the cells are repeated at intervals of the pitch Wc and the current flowing into the source electrode 14 in a unit cell region 13 is determined by the carriers flowing through the $n^-$ type drain layer 2 (region 2a) with the width Wc. However, in the unit cell region (border portion cell) 12 adjoining the gate bonding pad 15a, the current flowing into the source electrode 14 is determined by the carriers flowing through the $n^-$ type drain layer 2 (region 2b) with the width Wc and WG, i.e., the current density in this cell becomes greater than that in the unit cell region 13 spaced from the gate bonding pad 15a. Accordingly, the voltage drop due to the current flowing through the p type base layer 5 of the unit cell region 12 adjoining the gate bonding pad 15a becomes greater than that in the unit cell region 13 spaced from the gate bonding pad 15a. Therefore, the latch-up phenomenon occurs more easily in the unit cell region 12 adjoining the gate bonding pad 15a and this causes the lowering of the latch-up current.

At the time when the element is turned off, since, in the region 11 and region 12 in FIG. 26, the minority carriers (holes) accumulated in the region 2b wider than the region 2a are flowed out into the source electrode 14 of the unit cell region 12, its switching speed becomes lower than that in the unit cell region 13 in which the minority carriers accumulated only in the region 2a are flowed out into the source electrode 14.

The above described phenomenon occurs not only in the vicinity of the gate bonding pad 15a but, as it is confirmed, at other border portion of the cells, as well, i.e., in the vicinity of the gate contact running region and the source bonding pad region.

Accordingly, a configuration for extracting the accumulated carriers into the source electrode 14 by making use of the border portion cell 12 adjoining the gate bonding pad 15a is disclosed, for example, in U.S. Pat. No. 4,631,564 or Japanese Laid-open Patent Publication No. 63-104480. The configuration is shown in FIG. 27.

As shown in FIG. 27, the p type base layer 5 for the border portion cell 12 shown in FIG. 26 is formed in contiguity with the $p^+$ well layer (p type pad well layer) 8 provided under the gate bonding pad 15a for shielding the gate bonding pad 15a from the $n^-$ type drain layer 2, so that the holes accumulated under the pad are extracted via the $p^+$ well layer 8 and through a contact hole formed by making use of the border portion cell 12 into the source electrode 14.

However, as to the design of the power switching element, it is lately desired to have the cell miniaturized so that a longer circumferential length of the channel may be obtained and as many cells as possible may be provided in the same chip area, thereby reducing the ON resistance still more and enhancing the capability of the power switching element to flow a large current, and also to have the cell miniaturized so that the element size may be decreased with the performance of the element remaining as it is.

To meet such demands, it is presumed that the cell will be miniaturized still more. However, a certain area is needed for the pad region in question to achieve wire bonding. Hence, the area for the pad region compared to the cell area has a tendency to increase as the cell becomes smaller in size. Consequently, with the conventional structure as shown in FIG. 27, the phenomenon of latch up easily occurs at the unit cell region (region 13) which newly becomes the border portion cell, and further, the turn-off time cannot be expected to be reduced so much.

SUMMARY OF THE INVENTION

The present invention has been made in view of the above described points of problem. Accordingly, an object of the present invention is to provide an insulated gate bipolar transistor capable of achieving an improvement in the latch-up current and shortening in the turn-off time simultaneously, even when the cell is miniaturized still more.

Another object of the present invention is to provide a production method capable of producing the insulated gate bipolar transistor as described above.

The insulated gate bipolar transistor of the present invention structured so as to achieve the above mentioned objects comprises a semiconductor substrate of a first conductivity type, a semiconductor layer of a second conductivity type formed on the substrate having a first region and a second region which is on the border of the first region, base layers of the first conductivity type formed at a plural regions of the surface of the first region of the semiconductor layer such that their junctions with the semiconductor layer terminate at the surface of the semiconductor layer, source layers of the second conductivity type formed in the base layer of each of unit cells, the unit cell being constituted of each of the plural base layers, such that its junction with the base layer terminates at the surface of the base layer along and at a distance from the termination of the border of the base layer, a gate electrode formed at least over a channel region with a gate insulating film interposed therebetween, the channel region being constituted of the distance of the surface of the base layer between the semiconductor layer and the source layer, a source electrode having contacts with both the base layer and the source layer in each of the unit cell, and a minority carrier extracting layer of the first conductivity type formed at the surface of the second region which is on the border of the first region of the semiconductor layer such that its junction with the semiconductor layer terminates at the surface of the semiconductor layer and provided with lower resistivity so as to flow out minority carriers, which have flowed from the semiconductor substrate into the second region of the semiconductor layer, into the source electrode.

The production methods includes the first step, after preparing a semiconductor substrate of a first conductivity type provided with a semiconductor layer of a second conductivity type on a major surface thereof, for forming well layers of the first conductivity type, in a first region and a second region which is on the border of the first region, at a plural regions of the surface of the first region and at a region of the surface of the second region such that their junctions with the semiconductor layer terminate at the surface of the semiconductor layer, the second step for forming a gate electrode over the surface of the semiconductor layer with a gate insulating film interposed therebetween such that the gate electrode is located at least in the vicinity of the termination of the border of the each well layer formed at the surface of the first region of the semiconductor layer and has such a pattern that its extensions extending from the first region side to the second region by a predetermined length are repeatedly arranged on the well layer formed at the surface of the second region along its boundary with the first region, the third step for forming, in the first region, a base layer of the first conductivity type in a self alignment manner by the gate electrode such that its junction with the semiconductor layer terminates at the surface of the semiconductor layer, the base layer constituting a unit cell, and for forming a source layer of the second conductivity type in a self alignment manner by the gate electrode such that its junction with the base layer terminates at the surface of the base layer, along and at a distance from the termination of the border of the base layer, the fourth step for introducing a high concentration of impurities of the first conductivity type into the surface of the base layer constituting the unit cell and the surface of the well layer of the second region to have their resistivity lowered still more by means of the high impurity concentration, the fifth step for forming an interlayer insulating film over the surface of the semiconductor layer with the gate electrode interposed therebetween, the interlayer insulating film having a first opening in the first region opening on to both the base layer and source layer of the unit cell, a second opening in the second region opening on to the well layer given a high concentration of impurities, and a third opening in the second region opening on to the extensions of the gate electrodes, and the sixth step for forming a source electrode, which is to be electrically connected, through the first opening, with both the base layer and the source layer in the firs region, and to be also electrically connected, through the second opening, with the well layer given a high concentration of impurities in the second region, and for forming a gate electrode pad, which is to be electrically connected, through the third opening, with the gate electrode in the second region, the source electrode and the gate electrode pad being formed on the interlayer insulating film such that they are electrically isolated from each other.

The insulated gate bipolar transistor according to the present invention having the above described structure, when each unit cell is driven by the gate electrode in the first region in which the unit cells are arranged, the distance of the surface of the base layer between the semiconductor layer and the source layer serves as the channel region and majority carriers flow from the source electrode into the semiconductor layer through the channel region. Then, minority carriers flow from the semiconductor substrate into the semiconductor layer, whereby conductivity modulation takes place in the semiconductor layer and the element is allowed to conduct.

At this time, minority carriers from the semiconductor substrate flow into the second region of the semiconductor layer being located on the border of the first region. The minority carriers flowed into the second region are flowed out into the source electrode through the minority carrier extracting layer of the first conductivity type formed at the surface of the second region so as to have low resistivity.

Therefore, it is made possible to prevent the latch-up current value from lowering due to the minority carriers, which have accumulated in the second region, flowing into the unit cell located at the border portion of the first region and adjoining the second region, thereby increasing the current density therein.

Further, the minority carriers flowing from the semiconductor substrate into the second region during the operation of the element and being accumulated in the second region of the semiconductor layer, at the turn off of the element, are quickly flowed out into the source electrode through the minority carrier extracting layer of the first conductivity type formed at the surface of the second region so as to have lower resistivity. The same performance will be exhibited even when the cell is further miniaturized.

In the production method of the element, since the pattern of the gate electrode is arranged such that virtually no gate electrode is existing on the second region, the well layer (second region) for extracting the minority carriers can be easily given a higher concentration of impurities.

The process for giving the higher concentration can be executed simultaneously with the process for lowering the contact resistance of the base layer. Hence, the number of masking steps dose not increase in substance.

According to the present invention as described above, even if miniaturization of the cell is advanced, a good effect can be obtained that enhancement of the latch-up current value and shortening in the turn-off time can be attained at the same time.

DETAILED DESCRIPTION OF THE EMBODIMENTS

Below will be described the present invention as related to embodiments illustrated in the accompanying drawings.

Figure 1:
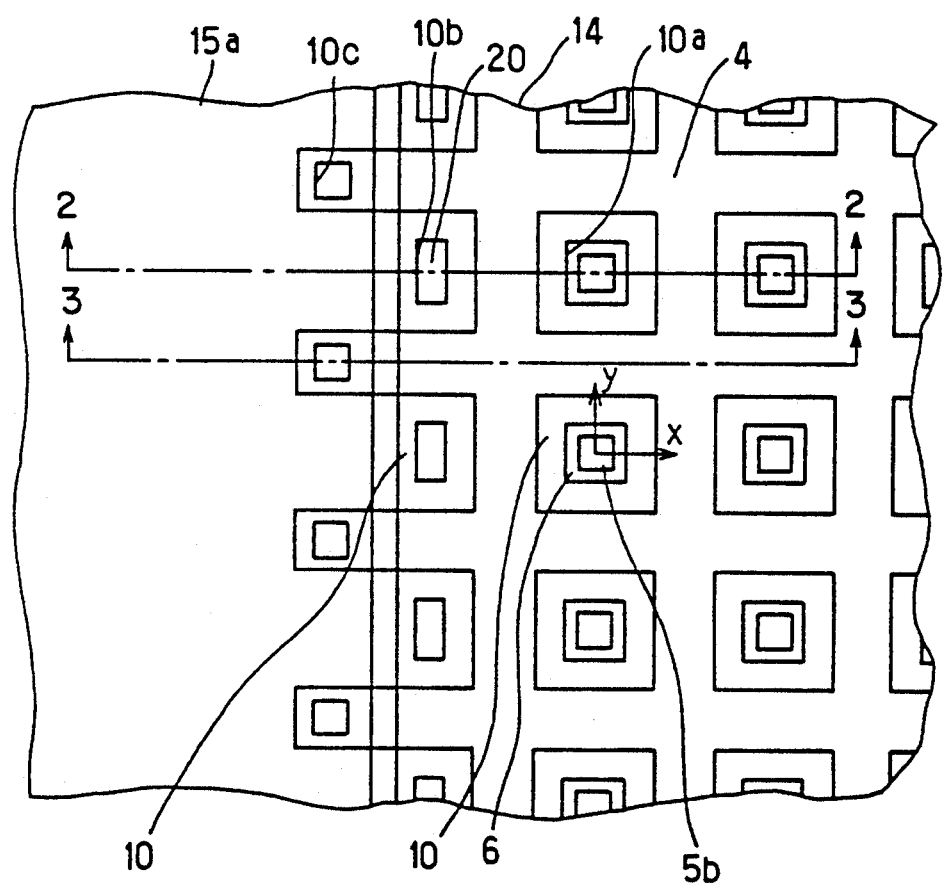
FIG. 1 is a schematic plan view of surface pattern structure showing the structure in the vicinity of the gate bonding pad 15a of an insulated gate bipolar transistor with a first embodiment of the present invention applied thereto.
Figure 2:
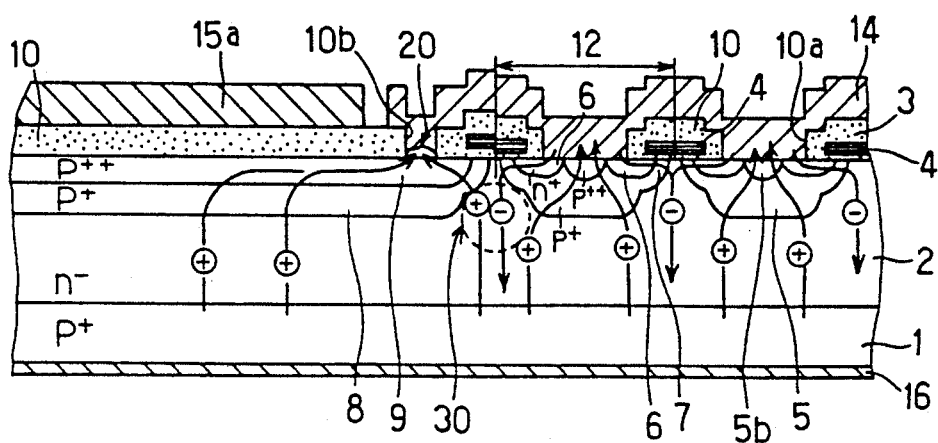
FIG. 2 and FIG. 3 are respectively a sectional view taken along line 2—2 and a sectional view taken along line 3—3 in FIG. 1.
Figure 3:
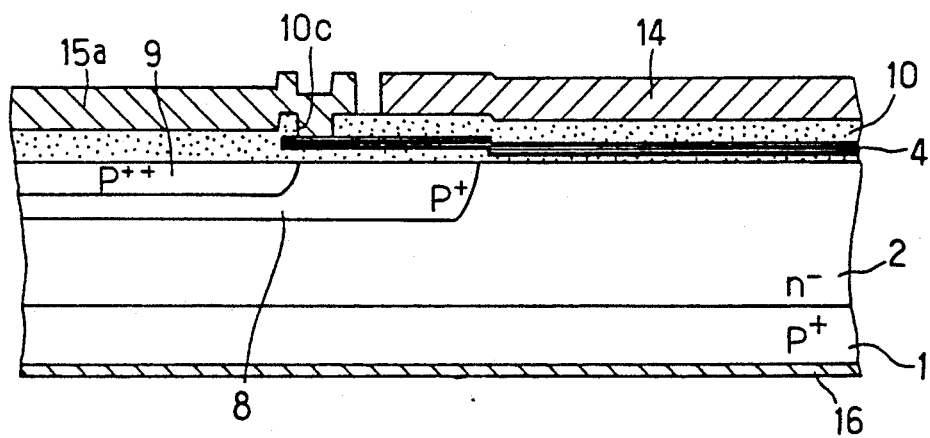
Figure 25:
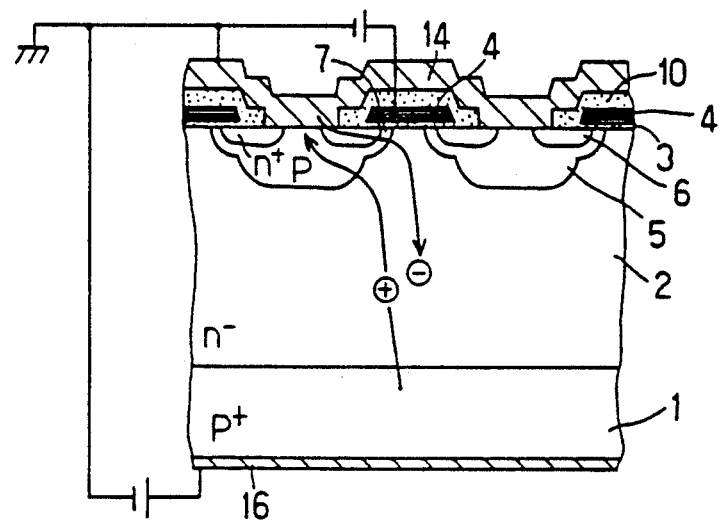
FIG. 25 is a longitudinal sectional view showing a basic structure of an insulated gate bipolar transistor.
Figure 26:
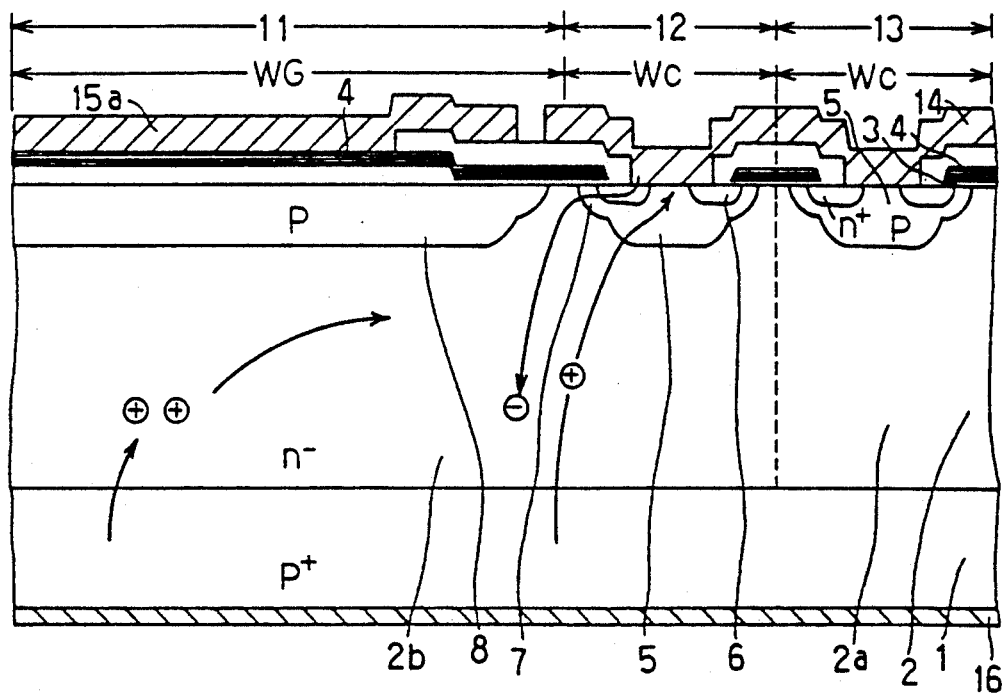
FIG. 26 is a sectional structural drawing of the portion in the vicinity of the gate bonding pad of the insulated gate bipolar transistor shown in FIG. 25.
Figure 27:
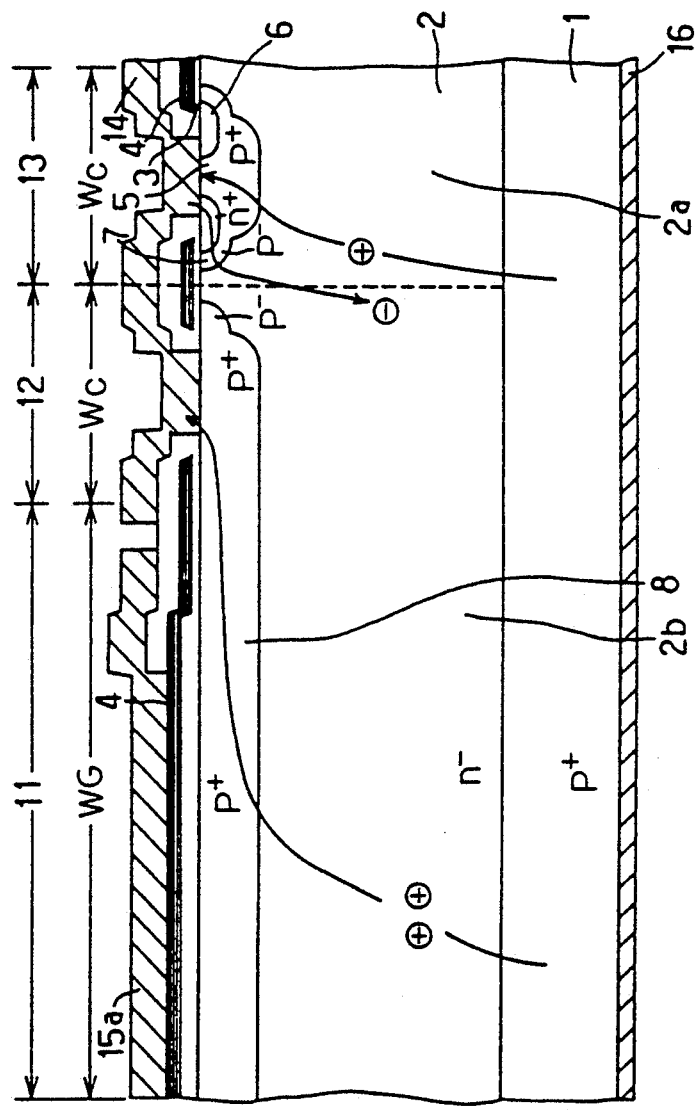
FIG. 27 is a sectional structural drawing of the portion in the vicinity of the gate bonding pad of an insulated gate bipolar transistor provided with a conventional hole extracting arrangement.

FIG. 1 to FIG. 3 show the structure in the vicinity of the gate electrode pad (gate bonding pad 15a) of an insulated gate bipolar transistor to which a first embodiment of the present invention is applied. FIG. 1 is a plan view schematically showing the surface pattern structure, FIG. 2 is a sectional view taken along line 2—2 in FIG. 1, and FIG. 3 is a sectional view taken along line 3—3 in FIG. 1. Corresponding parts to those in FIG. 25 to FIG. 27 are denoted by corresponding reference numerals.

The embodiment will be described below in detail according to its production process.

Figure 4:
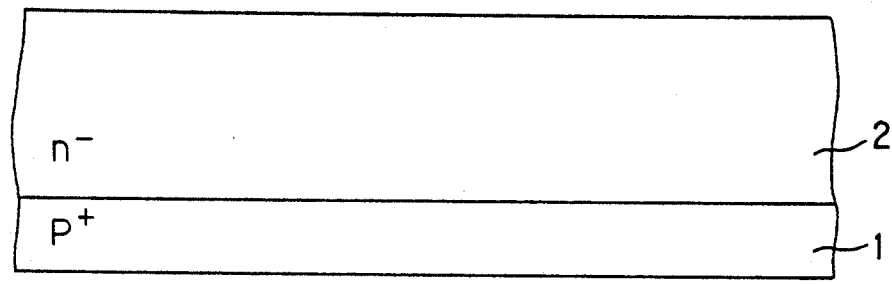
FIG. 4 to FIG. 18 are drawings useful for explaining the production process of the first embodiment shown in FIG. 1 to FIG. 3 in sequence of the production process.
Figure 5:
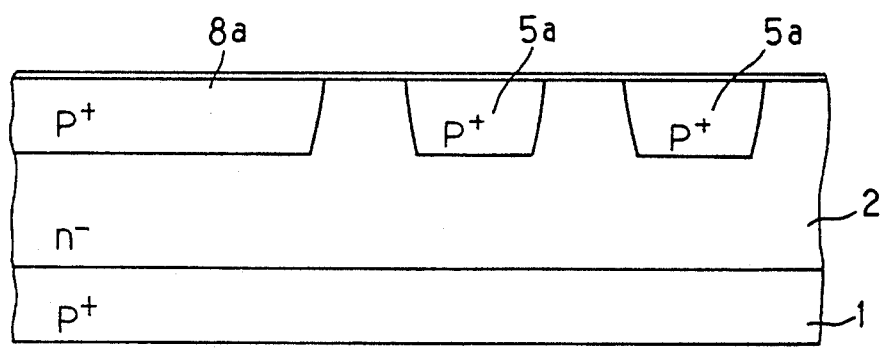

First, a p+ type silicon substrate as a semiconductor substrate is prepared and an n− type layer is formed thereon by epitaxial growth to a thickness of approximately 100 μm as a semiconductor layer of low impunity concentration and with specific resistance 30 $\Omega$−cm. By these p+ type silicon substrate and n− type layer, the p+ type drain layer 1 and the n− type drain layer 2 are formed, respectively, as shown in FIG. 4. In order to prevent the surface of the silicon wafer from being contaminated in the following steps, a thermal oxide film (field oxide film) is formed on the surface. Then, on the surface of the oxide film over the n− type drain layer 2, a resist film of a pattern with openings made therein at the positions where the electrode pad region and the p type base layer are to he formed is formed by ordinary photolithography, boron ions are implanted using the resist film as a mask, and drive in and field oxide are applied to the wafer, whereby p+ type wells 5a and 8a are selectively formed as shown in FIG. 5.

Figure 6:
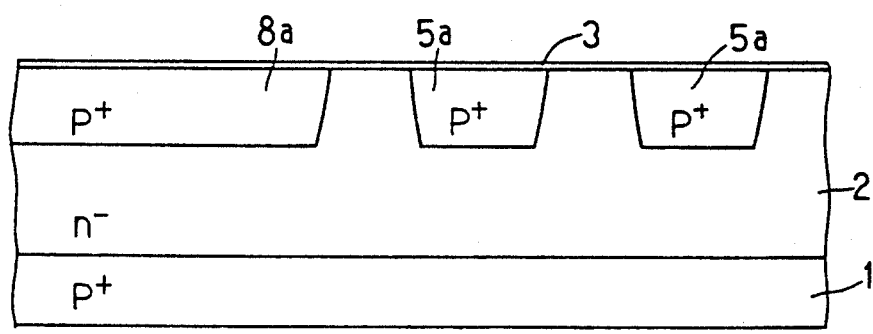

After the field oxide film is partially and selectively etched by photo-etching, the surface of the n− type drain layer 2 is oxidized so that the gate oxide film 3 is formed as shown in FIG. 6. Although the field oxide film over the p+ type well 8a of the electrode pad region was left as it is in the conventional structure, it is totally removed in the present embodiment. This is because ion implantation into the p+ type well 8a is performed again in a later step. Then, polysilicon which is doped to a high impurity concentration, which becomes the gate electrode, is deposited on the entire surface of the wafer to a thickness of approximately 5000 Å, whereby the gate electrode 4 in a pattern of a lattice form and extending up to the gate electrode pad region as shown in the plan view of FIG. 7 is formed.

Figure 7:
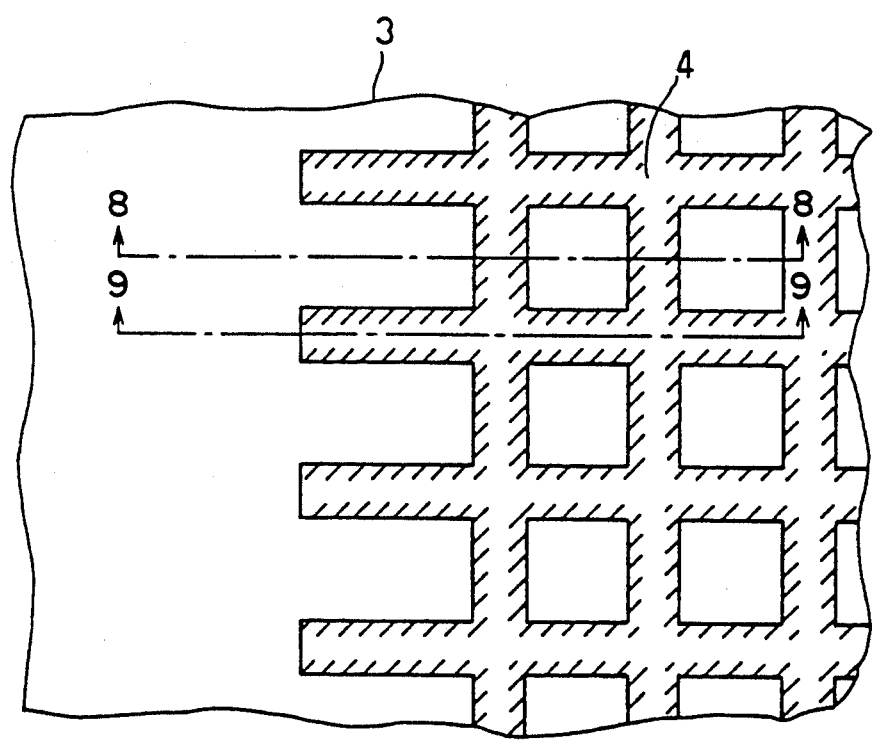
Figure 8:
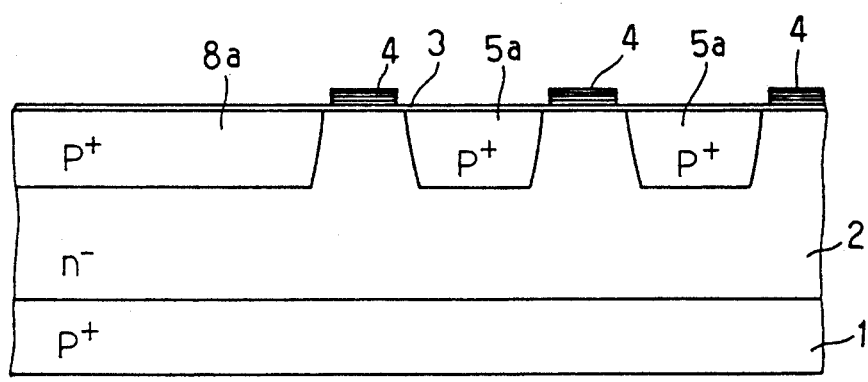
Figure 9:
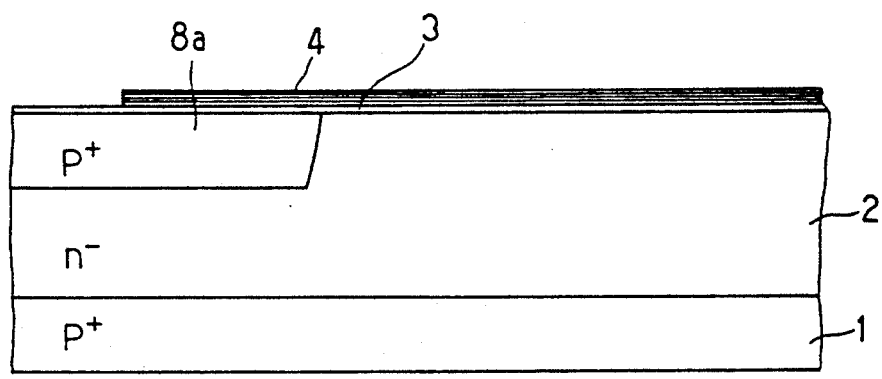

The gate electrode 4 is arranged, as shown in FIG. 8 showing a sectional view taken along line 8—8 in FIG. 7 and in FIG. 9 showing a sectional view taken along line 9—9 in FIG. 7, such that its portion extending to and overlapping the p+ type well 8a at the terminating portion of the p+ type well 8a has a comb-teeth pattern, which means that there is deposited substantially no polysilicon film on the p+ type well 8a except the extensions.

Figure 10:
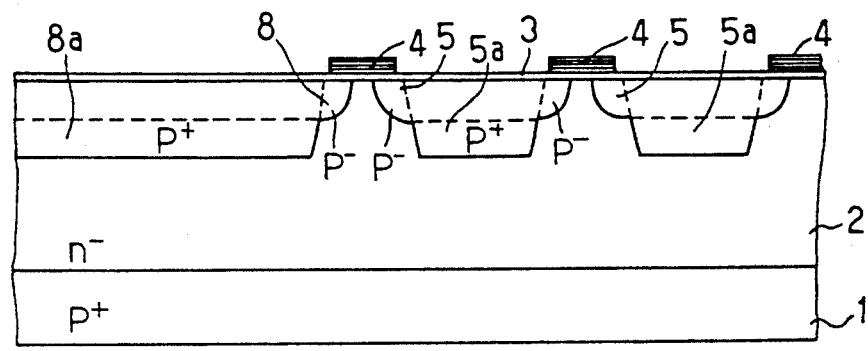

Thereafter, boron ions are implanted using the gate electrode 4 as the mask and the wafer is subjected to drive in so that diffusion of 3 Jm takes place, whereby the p type base layer 5 and the p type pad well layer 8 under the gate electrode pad are formed together with the p+ type wells 5a and 8a as shown in FIG. 10.

Figure 11:
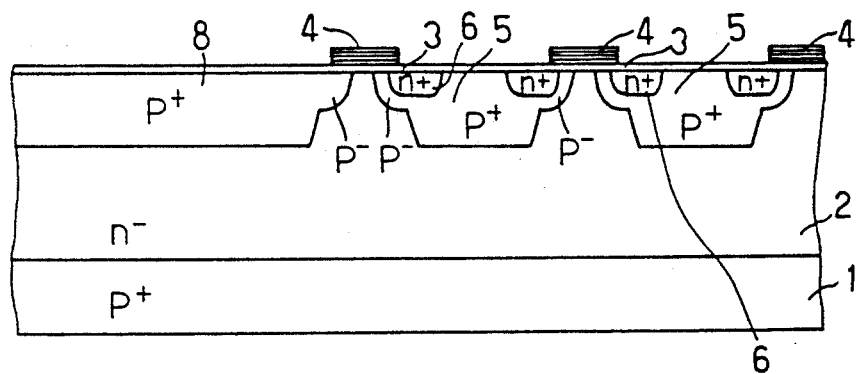

Then, through the windows formed by the gate electrode 4, the center portion of each unit cell and the entire surface of the pad region are covered with a resist film, by ordinary photolithography, formed in a pattern having openings only at the positions where n+ type source layers 6 are to be formed, phosphor ions are implanted using the resist film and the gate electrode 4 as the mask, and drive in diffusion is allowed to take place after the resist has been removed, whereby the n+ type source layers 6 are formed only in the regions where the unit cells are formed as shown in FIG. 11.

Figure 12:
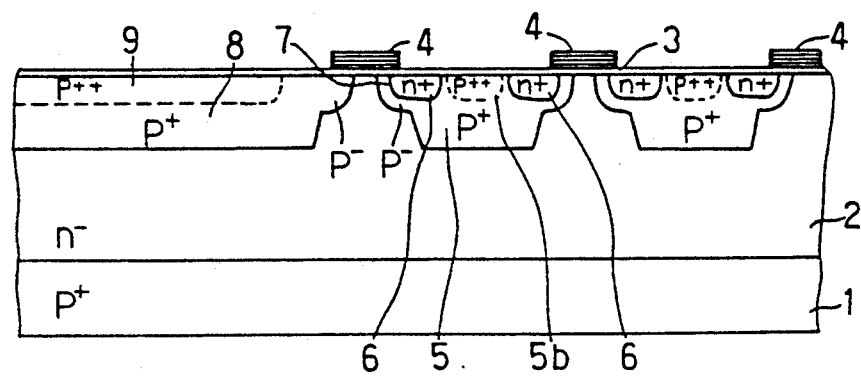

Then, boron ions are implanted using a resist pattern formed by ordinary photolithography as the mask and drive in diffusion is allowed to take place, whereby p++ type contact layers 5b contributing to reduction in contact resistance between the p type base layer 5 and the source electrode 14 and p++ type pad layers 9 providing higher surface concentration to the p type pad well layer 8 so as to contribute to decrease its resistance are formed as shown in FIG. 12. At this time, since there is present no polysilicon film, which is formed on the entire surface of the pad region of the silicon wafer as with the conventional structure, for connecting the gate electrode 4 and the bonding pad, the p++ type pad layer 9 can be formed substantially on the entire surface of the p+ type pad well layer 8.

Figure 13:
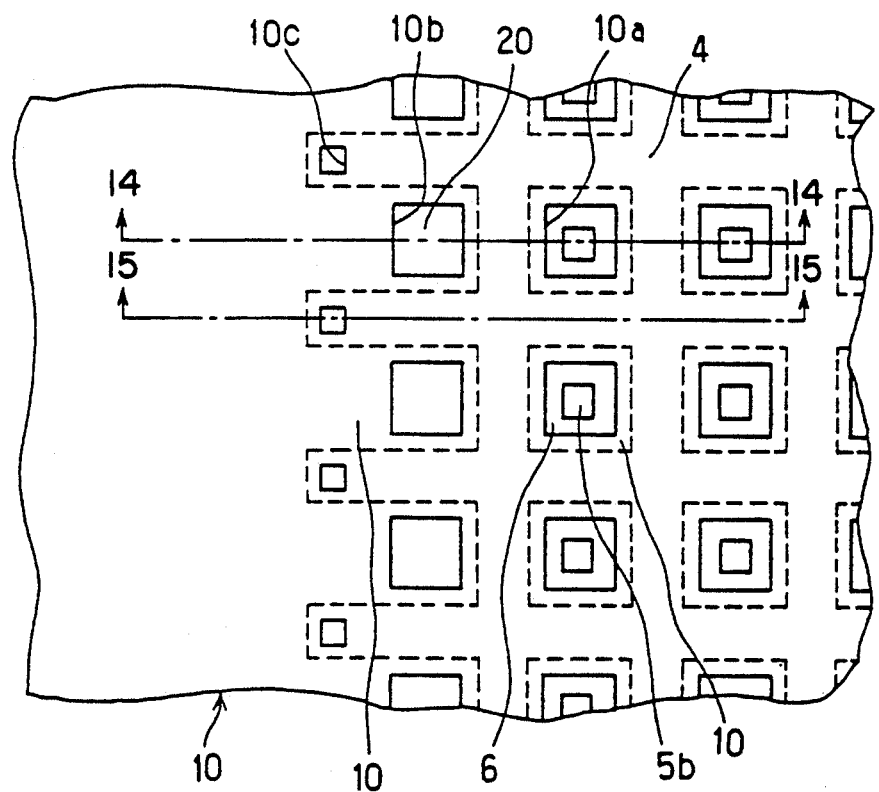
Figure 14:
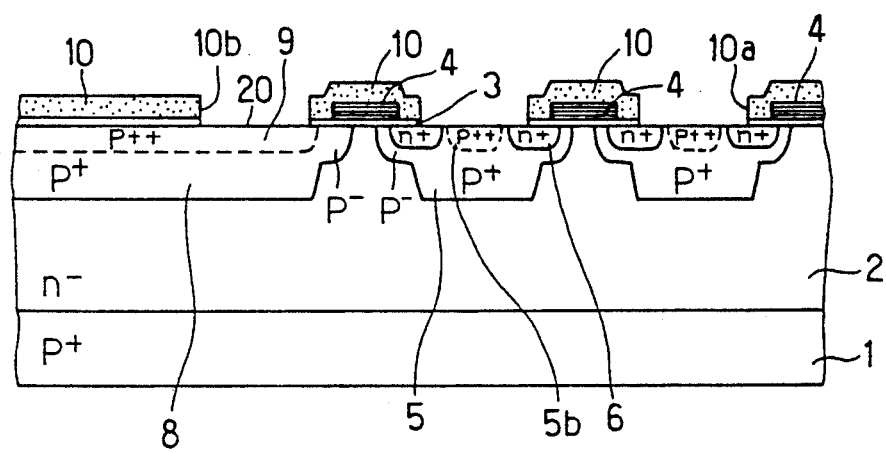
Figure 15:
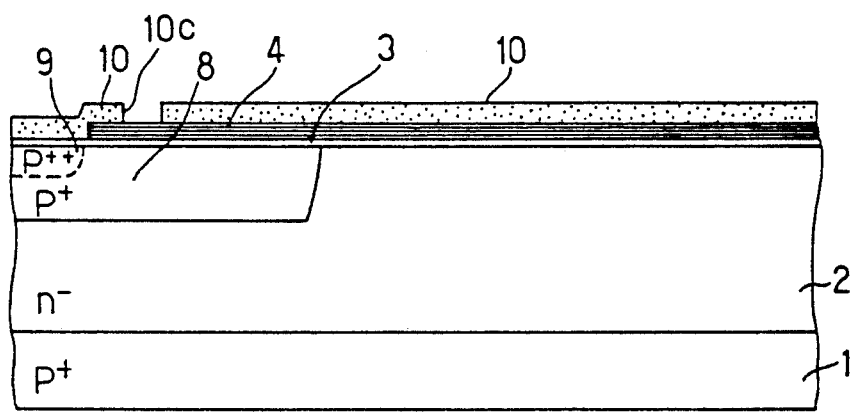

In the described manner, the channel 7 is formed by the so-called DSA technique (Diffusion Self Alignment) in which the p type base layer 5 and the n+ type source layer 6 are aligned by the gate electrode 4 used as the mask in common. Then, oxide film of PSG, BPSG, etc. is deposited by CVD, whereby an interlayer insulating film 10, which has contact holes 10a opening on to both the p type base layer 5 (p++ type contact layer 5b) and the n+ type source layer 6, contact holes 10b opening on to the region 20 of the p++ type pad layer 9 having a comb-teeth form under the periphery of the gate electrode pad region and extending toward the cell region, and contact holes 10c connecting the gate electrode pad metal (gate bonding pad 15a) and the gate electrode 4, is formed. The relative surface pattern is shown in a plan view of FIG. 13, a sectional view taken along line 14—14 in FIG. 13 is shown in FIG. 14, and a sectional view taken along line 15—15 in FIG. 13 is shown in FIG. 15.

Figure 16:
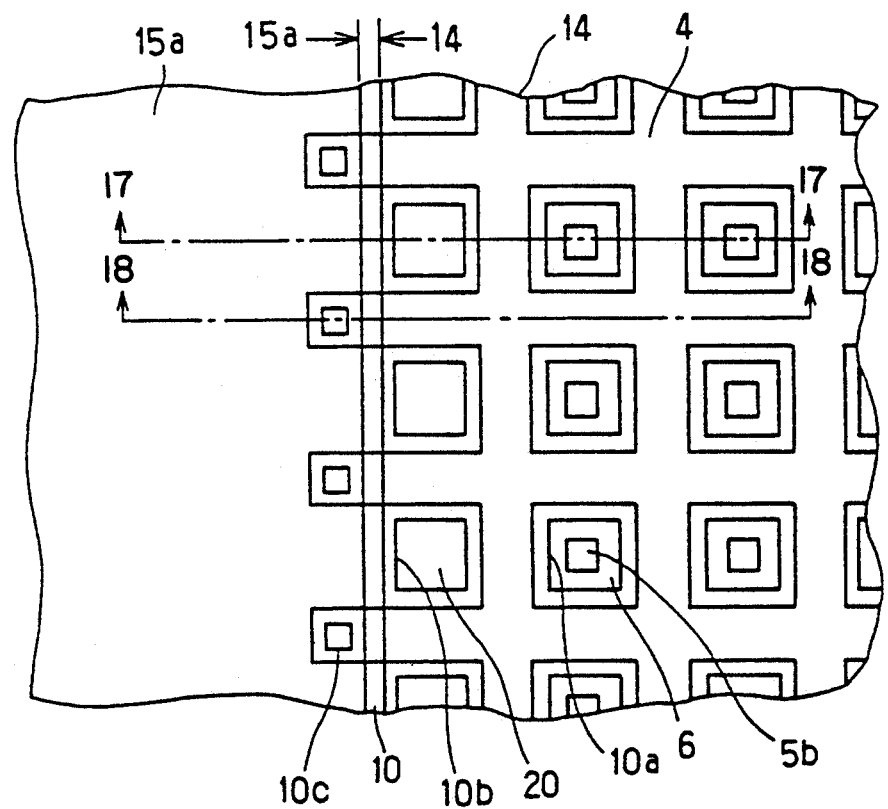
Figure 17:
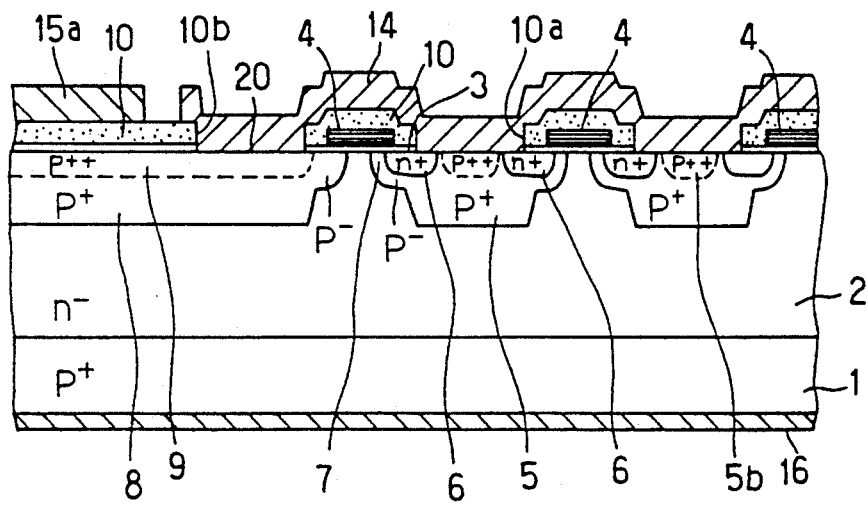
Figure 18:
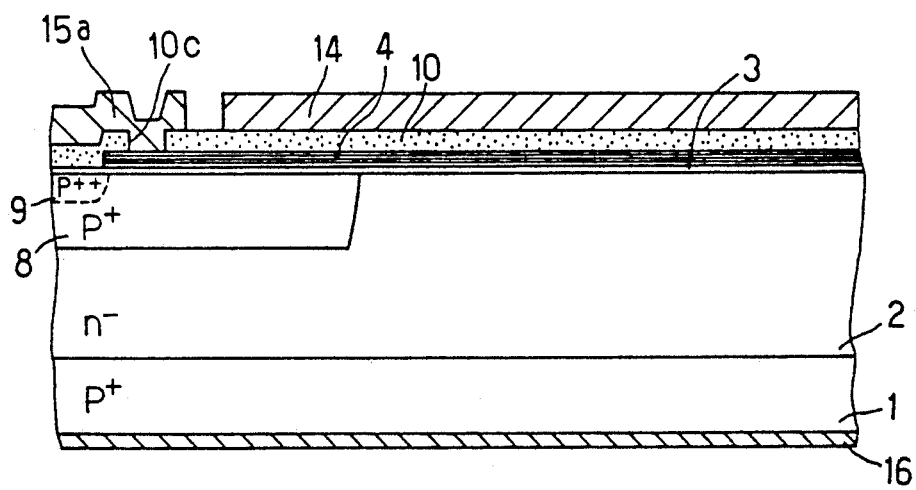

Then, by evaporation and patterning of an aluminum film, the source electrodes 14 and the gate electrode pads (gate bonding pads 15a) are formed on the surface of the wafer as shown in FIG. 16. At this time, through the above described contact holes, the source electrode 14 is electrically connected, in the unit cell region, with both the p type base layer 5 (p++ type contact layer 5b) and the n+ type source layer 6 as shown in FIG. 17 and FIG. 18 and also electrically connected with the region 20 of the periphery of the p++ type pad layer 9 provided under the gate bonding pad 15a as shown in FIG. 17. Further, the gate bonding pad 15a is electrically connected with the extensions of the gate electrode 4.

Finally, a metallic film is evaporated on the obverse surface of the substrate, i.e., on the back side of the p+ type drain layer 1, whereby the drain electrode 16 is formed, and thus, the insulated gate bipolar transistor as shown in FIG. 1 to FIG. 3 is fabricated.

In the insulated gate bipolar transistor fabricated as described above, there is formed the p++ type pad layer 9, which is adapted to have low resistance by being given a high concentration of impurities, within the p+ well layer 8 under the gate bonding pad 15a as shown in FIG. 1 to FIG. 3, and further, this p++ type pad layer 9 is arranged to ohmically contact, at the region 20, with the source electrode 14 through the contact hole 10b. Therefore, the holes (minority carriers) injected into the n− type drain layer 2 from the p+ type drain layer 1 under the gate electrode pad region during the operation of the element are extracted, before they flow into the unit cell region (border portion cell) 12 adjacent to the gate electrode pad region, by the source electrode 14 through the p type pad well layer 8, the p++ type pad layer 9, the region 20 of the p++ type pad layer 9, and the contact hole 10b. Further, since the p++ type pad layer 9 serves as a low-resistance path for the holes, the holes existing at a boundary region 30 between the border portion cell 12 and the portion under the gate bonding pad 15a are also easily extracted from the region 20 to the source electrode 14. That is, a concentration of the holes into the border portion cell 12 is avoided and, hence, the lowering of the latch-up current amount due to occurrence of the latch-up phenomenon at the border portion cell 12 can be prevented and, thus, an improvement in the latch-up current can be achieved.

Further, since, at the time of the gate turn-off, the holes accumulating under the gate bonding pad 15a quickly flow out into the source electrode 14 from the region 20 through the p++ type pad layer 9 given lower resistivity, combined with the effect of the holes being extracted, during the operation of the element, from the region 20 of the p++ type pad layer 9 into the source electrode 14 as described above, a shortening in the turn-off time can be achieved.

In addition, since the p++ type pad layer 9, together with the p++ type contact layer 5b, is formed in a self-aligned manner by the gate electrode 4, any masking step need not be increased. Further, only by modifying the pattern of the gate electrode 4 in the vicinity of the gate bonding pad 15a, the area of the opening of the contact hole 10b opening on to the region 20 of the p++ type pad layer 9 arranged to have a comb-teeth form under the periphery of the gate bonding pad 15a can be easily enlarged. Hence, the effect of extracting the holes through the contact hole 10b can be enhanced.

The p++ type pad layer 9 can he formed virtually on the entire area of the p type pad well layer 8, and therefore, even if the base contact area is reduced as the unit cell is more miniaturized, the p++ type pad layer 9 as the path for extracting the holes accumulating under the pad can have much lower resistance than that in the conventional structure.

Figure 19:
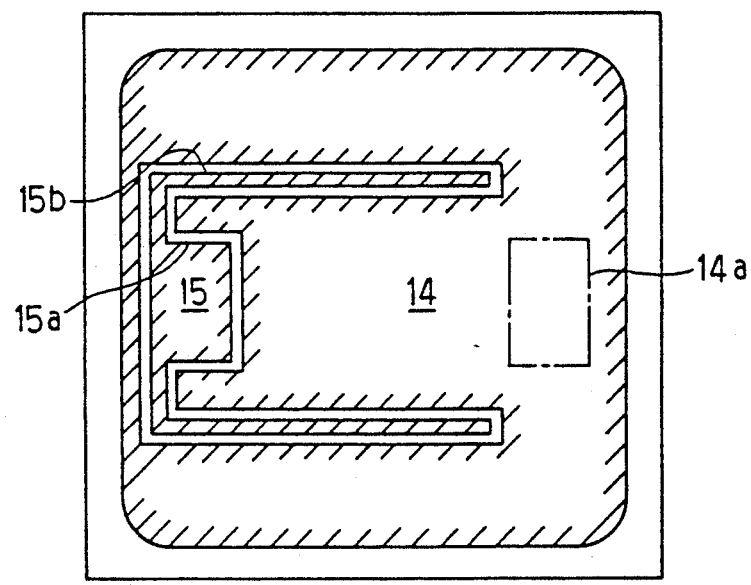
FIG. 19 is a plan view of an insulated gate bipolar transistor.

In practice, as shown in FIG. 19, the gate electrode pad 15 of the insulated gate bipolar transistor includes the rectangular gate bonding pad 15a and gate contact running region 15b in the form of relatively long narrow lines contiguous with the gate bonding pad region 15a. The present invention is applicable to the vicinity of the gate contact running region 15b. Referring to FIG. 19, reference numeral 14 denotes the source electrode and 14a denotes a source electrode bonding region.

Figure 20:
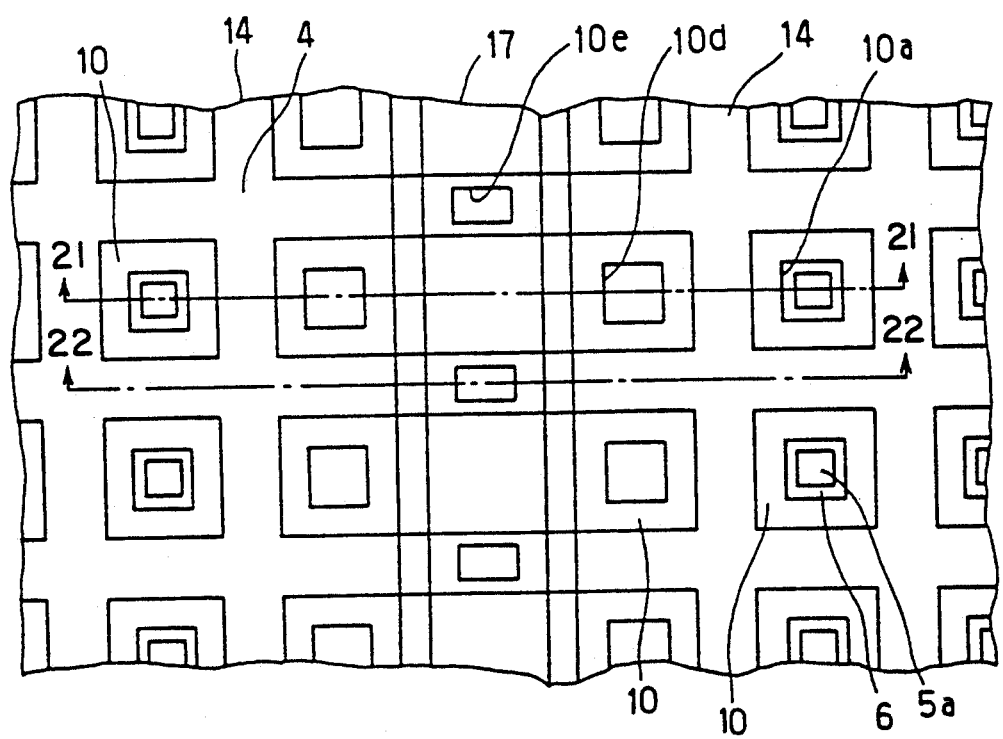
FIG. 20 is a schematic plan view of surface pattern structure showing the structure in the vicinity of the gate contact running region 15b of an insulated gate bipolar transistor with the present invention applied thereto.
Figure 21:
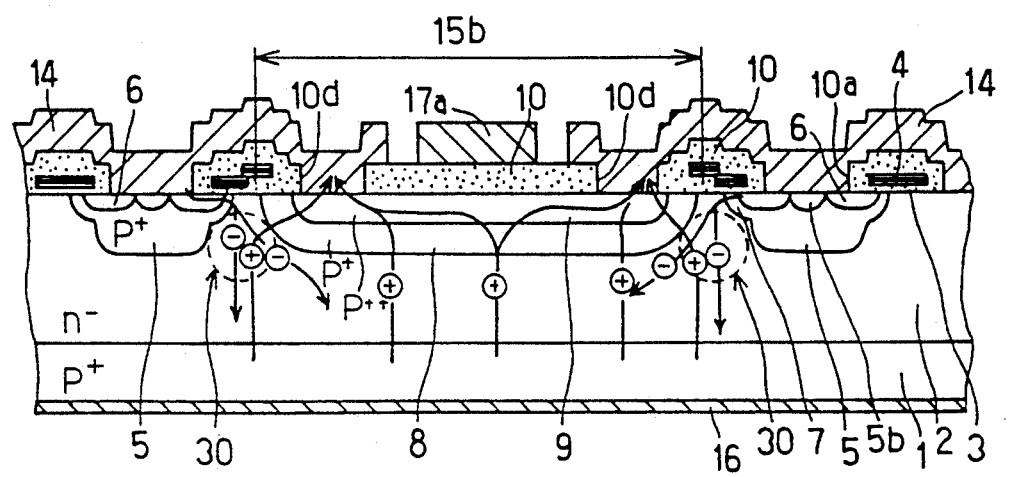
FIG. 21 and FIG. 22 are respectively a sectional view taken along line 21—21 and a sectional view taken along line 22—22 in FIG. 20.
Figure 22:
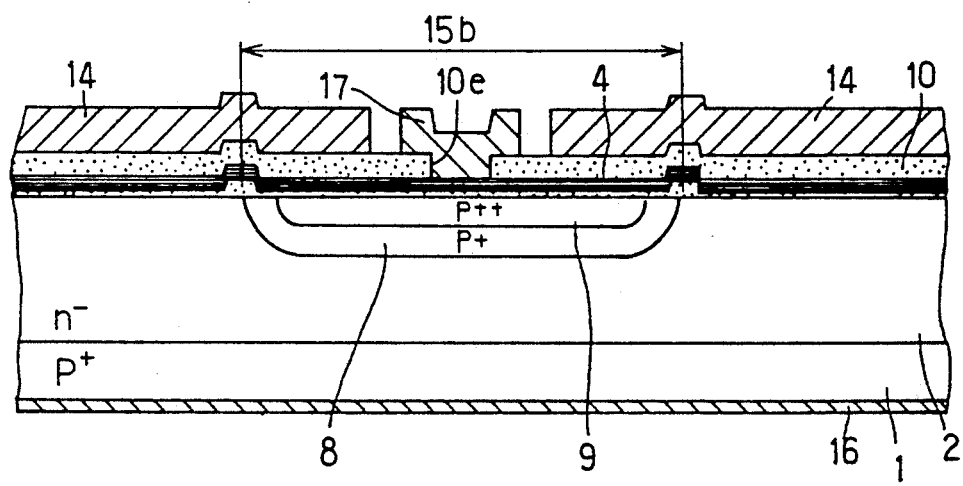

A second embodiment with the present invention applied to the vicinity of the gate contact running region 15b of the insulated gate bipolar transistor will be described below with reference to FIG. 20 to FIG. 22. FIG. 20 to FIG. 22 show the structure of the insulated gate bipolar transistor in the vicinity of the gate contact running region 15b, of which FIG. 20 is a plan view schematically showing the surface pattern structure, FIG. 21 is a sectional view taken along line 21—21 in FIG. 20 and FIG. 22 is a sectional view taken along line 22—22 in FIG. 20. Corresponding parts to those in FIG. 1 to FIG. 3 are denoted by corresponding reference numerals.

In the production method shown in FIG. 4 to FIG. 18 described above, in the step of forming the p type pad well layer 8, a $p^+$ type well layer 8 is simultaneously formed under the gate contact running region 15b, and, further, in the step shown in FIG. 12, a large number of boron ions are implanted into the surfaces, and thereby, the $p^{++}$ type pad layer 9 serving as the hole extracting path under the gate contact running region 15b is formed. In the step of forming the contact holes through the interlayer insulating film 10, by opening contact holes 10d and 10e and forming aluminum films by evaporation and patterning, the $p^{++}$ type pad layer 9 and the source electrode 14, and the gate electrode 4 and the gate electrode runner metal 17, are electrically connected, respectively. The gate electrode runner metal 17 is formed by patterning aluminum film at the same time as the source electrode 14 and the gate bonding pad 15a.

Through the above described process, the configuration shown in FIG. 20 to FIG. 22 is fabricated, wherein the holes collecting under the gate contact running region 15b are extracted into the source electrode 14 through the $p^{++}$ type pad layer 9, as with the application of the present invention to the portion under the gate bonding pad 15a. Thus, the improvement in the latch-up current and decrease in the turn-off time can be realized in the vicinity of the gate contact running region 15b, as with the above described first embodiment.

Figure 23:
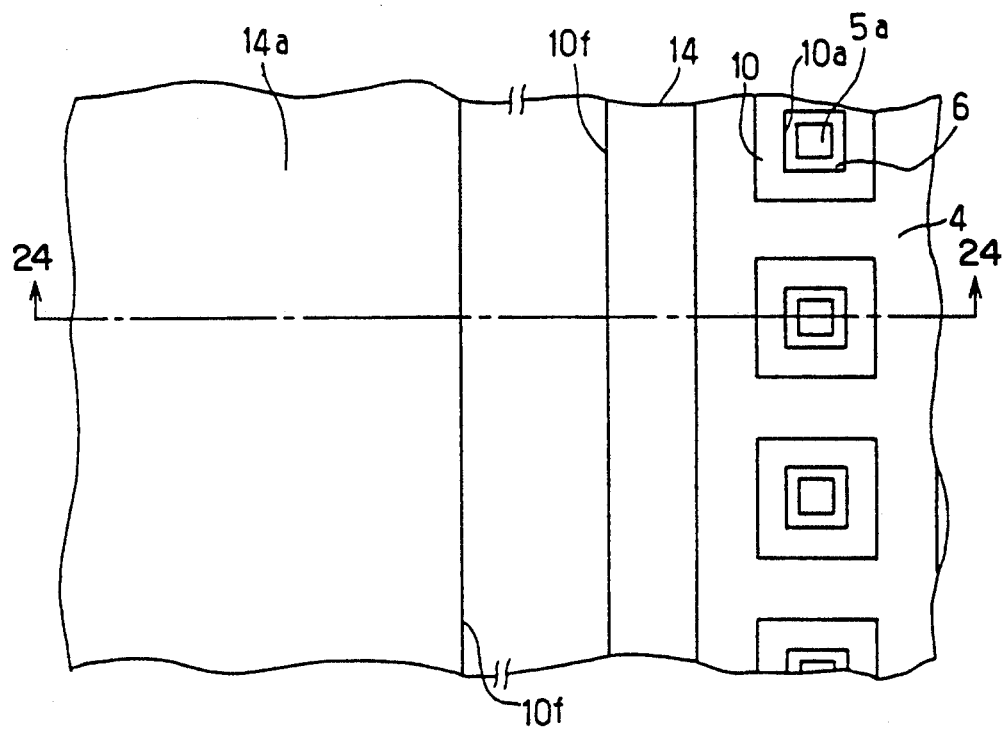
FIG. 23 is a schematic plan view of surface pattern structure showing the structure in the vicinity of the source bonding pad of an insulated gate bipolar transistor with the present invention applied thereto.
Figure 24:
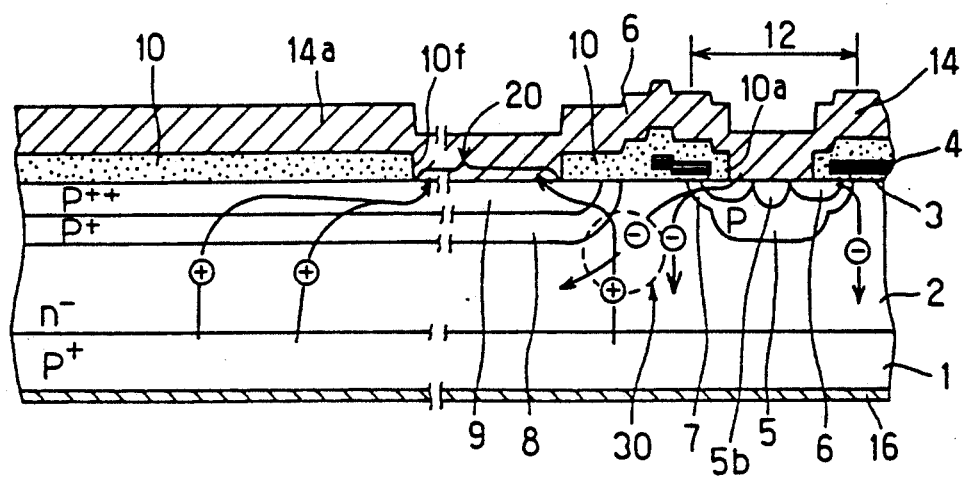
FIG. 24 is a sectional view taken along line 24—24 in FIG. 23.

The present invention can further be applied to the source bonding pad 14a of the insulated gate bipolar transistor shown in FIG. 19. FIG. 23 and FIG. 24 show the configuration of the insulated gate bipolar transistor in the vicinity of the source bonding pad 14a to which the present invention is applied, of which FIG. 23 is a plan view schematically showing the surface pattern structure and FIG. 24 shows a sectional view taken along line 24—24 in FIG. 23. Corresponding parts to those in FIGS. 1 to 3 and FIGS. 20 to 22 are denoted by corresponding reference numerals.

In this embodiment, like in the above described embodiments, the holes injected into the $n^-$ type drain layer 2 under the source bonding pad 14a are extracted from the $p^{++}$ type pad layer 9 under the source bonding pad 14a into the source bonding pad 14a through an annular contact hole 10f made under the periphery of the pad 14a. Consequently, similarly to the above described cases, an enhancement in the latch-up current and shortening in the turn-off time in the cell disposed in the vicinity of the source bonding pad 14a can be achieved.

The above described second embodiment may be applied to the boundary region between the guard-ring formed on the outermost circumference of the insulated gate bipolar transistor and border portion cells adjoining the guard-ring region.

Although the above described embodiments were of the application of the present invention to the arrangement of the unit cell region in which the cells are formed of square (lattice formed) cells, but the present invention is not limited to such arrangement but can be applied to those formed of stripe cells, hexagonal cells, and the like.

It is apparent that the size of the cell can be set arbitrarily. Further, the relative position of each cell shown, for example, in FIG. 1 may be such that is arbitrarily shifted in the x direction or y direction.

Further, though the insulated gate bipolar transistors described above were of the n channel type, the same effects can be obtained even if the present invention is applied to an insulated gate bipolar transistor of the opposite conductivity type, i.e., of the p channel type, in which types n and p of semiconductor in each layer are reversed.

What is claimed is:

1. A production method for producing an insulated gate bipolar transistor comprising:
   a first step, after preparing a semiconductor substrate of a first conductivity type provided with a semiconductor layer of a second conductivity type on a major surface thereof, forming well layers of the first conductivity type, in a first region and a second region which is on the border of said first region, at a plural regions of the surface of said first region and at a region of the surface of said second region such that their junctions with said semiconductor layer terminate at the surface of said semiconductor layer;
   a second step for forming a gate electrode over the surface of said semiconductor layer with a gate insulating film interposed therebetween such that said gate electrode is located at least in the vicinity of the termination of the border of the each well layer formed at the surface of said first region of said semiconductor layer and has such a pattern that its extensions extending from said first region side to said second region side by a predetermined length are repeatedly arranged on said well layer formed at the surface of said second region along its boundary with said first region;
   a third step for forming, in said first region, a base layer of the first conductivity type in a self alignment manner by said gate electrode such that its junction with said semiconductor layer terminates at the surface of said semiconductor layer, said base layer constituting a unit cell, and for forming a source layer of the second conductivity type in a self alignment manner by said gate electrode such that its junction with said base layer terminates at the surface of said base layer along and at a distance from the termination of the border of said base layer;
   a fourth step for introducing a high concentration of impurities of the first conductivity type into the surface of said base layer constituting said unit cell and the surface of said well layer of said second region to have their resistivity lowered still more by means of the high impurity concentration;

a fifth step for forming an interlayer insulating film over the surface of said semiconductor layer with said gate electrode interposed therebetween, said interlayer insulating film having a first opening in said first region opening on to both said base layer and source layer of said unit cell, a second opening in said second region opening on to said well layer given a high concentration of impurities, and a third opening in said second region opening on to said extensions of said gate electrodes; and a sixth step for forming a source electrode, which is to be electrically connected, through said first opening, with both said base layer and said source layer in said first region, and to be also electrically connected, through said second opening, with said well layer given a high concentration of impurities in said second region, and for forming a gate electrode pad, which is to be electrically connected, through said third opening, with said gate electrode in said second region, said source electrode and said gate electrode pad being formed on said interlayer insulating film such that they are electrically isolated from each other.

2. A production method for producing an insulated gate bipolar transistor according to claim 1, wherein said second openings and said third openings are formed over said well layer in said second region alternately disposed along the boundary between said second region and said first region.

* * * * *